U S010651625B2

United States Patent
Gerhard (10) Patent No.: US 10,651,625 B2
(45) Date of Patent: May 12, 2020

(54) METHOD OF PRODUCING A PLURALITY OF LASER DIODES AND LASER DIODE

(71) Applicant: OSRAM OLED GmbH, Regensburg (DE)

(72) Inventor: Sven Gerhard, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/046,173

(22) Filed: Jul. 26, 2018

(65) Prior Publication Data

US 2019/0036294 A1 Jan. 31, 2019

(30) Foreign Application Priority Data

Jul. 28, 2017 (DE) .................. 10 2017 117 135

(51) Int. Cl.
*H01S 5/028* (2006.01)
*H01S 5/02* (2006.01)
(Continued)

(52) U.S. Cl.
CPC ............ *H01S 5/028* (2013.01); *H01S 5/0201* (2013.01); *H01S 5/0202* (2013.01);
(Continued)

(58) Field of Classification Search
CPC .... H01S 5/0201; H01S 5/0208; H01S 5/0202; H01S 5/0421; H01S 5/22; H01S 5/3013;
(Continued)

(56) References Cited

U.S. PATENT DOCUMENTS

| 5,185,290 A | 2/1993 | Aoyagi et al. |
| 2008/0130698 A1* | 6/2008 | Bessho .................. B82Y 20/00 372/45.01 |

(Continued)

FOREIGN PATENT DOCUMENTS

| CN | 1347581 A | 5/2002 |
| CN | 101202421 A | 6/2008 |

(Continued)

OTHER PUBLICATIONS

First Office Action dated Jan. 20, 2020, of counterpart Chinese Application No. 201810844261.X, along with an English translation.

*Primary Examiner* — Armando Rodriguez
(74) *Attorney, Agent, or Firm* — DLA Piper LLP (US)

(57) ABSTRACT

A method of producing a plurality of laser diodes includes providing a plurality of laser bars in a compound, wherein the laser bars each include a plurality of laser diode elements arranged side by side, the laser diode elements each have a common substrate and a semiconductor layer sequence arranged on the substrate, and a splitting of the compound at a longitudinal separation line running between two adjacent laser bars in each case leads to formation of laser facets of the laser diodes to be produced, and structuring the compound at at least one longitudinal separation line, wherein a strained compensation layer is applied to the semiconductor layer sequence at least at the longitudinal separation line or the semiconductor layer sequence is at least partially removed.

13 Claims, 8 Drawing Sheets

(51) Int. Cl.
*H01S 5/32* (2006.01)
*H01S 5/042* (2006.01)
*H01S 5/22* (2006.01)
*H01S 5/30* (2006.01)
*H01S 5/40* (2006.01)
*H01S 5/10* (2006.01)
*H01S 5/20* (2006.01)

(52) U.S. Cl.
CPC .............. *H01S 5/0421* (2013.01); *H01S 5/22* (2013.01); *H01S 5/3013* (2013.01); *H01S 5/3201* (2013.01); *H01S 5/4043* (2013.01); *H01S 5/0282* (2013.01); *H01S 5/0425* (2013.01); *H01S 5/1082* (2013.01); *H01S 5/2086* (2013.01); *H01S 2301/173* (2013.01); *H01S 2301/176* (2013.01)

(58) Field of Classification Search
CPC .... H01S 5/3201; H01S 5/4043; H01S 5/0282; H01S 5/0425; H01S 5/1082; H01S 5/2086; H01S 2301/173; H01S 2301/176
See application file for complete search history.

(56) References Cited

U.S. PATENT DOCUMENTS

| | | |
|---|---|---|
| 2009/0238227 A1 | 9/2009 | Kubota et al. |
| 2009/0323750 A1 | 12/2009 | Inoue et al. |
| 2012/0326178 A1* | 12/2012 | Fehrer .................... H01L 24/24 |
| | | 257/88 |
| 2013/0028280 A1 | 1/2013 | Hongo et al. |
| 2013/0322477 A1 | 12/2013 | Kinugawa et al. |
| 2014/0145391 A1 | 5/2014 | Dachs |

FOREIGN PATENT DOCUMENTS

| | | |
|---|---|---|
| CN | 103503175 A | 1/2014 |
| DE | 40 25 144 A1 | 2/1991 |
| DE | 10 2013 220 641 A1 | 4/2015 |
| DE | 10 2015 119 146 A1 | 5/2017 |
| WO | 00/58999 A2 | 10/2000 |

* cited by examiner

METHOD OF PRODUCING A PLURALITY OF LASER DIODES AND LASER DIODE

TECHNICAL FIELD

This disclosure relates to a method for the production of a plurality of laser diodes, in particular, laser diodes separated from a plurality of laser bars present in a compound.

BACKGROUND

A possible method for the separation of laser bars arranged in a compound is the breaking of the laser bars. In that method, the compound is preferably selectively broken on crystal planes of a material used for the laser bars to form laser facets of the laser diodes to be produced. Ideally, the fractured surfaces are atomically smooth to exhibit a low roughness suitable for laser operation and sufficient optical reflectivity.

However, formation of the laser facets represents a technical challenge since various factors such as the type of the breaking method, initiation of the fracture at the notches inserted and global and local strain conditions of the laser bar compound influence the quality of the laser facets. For example, under unfavorable strain conditions, crystal dislocations can occur at the laser facets, which on the one hand impair reflectivity and lead to a lower luminous efficacy and on the other hand represent a quality risk since they can lead to spontaneous failures. However, a fundamental structural change in the laser bar compound cannot easily be made since this can impair both the breaking and functionality of the finished laser diodes.

It could therefore be helpful to provide an improved method for the production of a plurality of laser diodes, as well as a laser diode with improved quality.

SUMMARY

I provide a method of producing a plurality of laser diodes including providing a plurality of laser bars in a compound, wherein the laser bars each include a plurality of laser diode elements arranged side by side, the laser diode elements each have a common substrate and a semiconductor layer sequence arranged on the substrate, and a splitting of the compound at a longitudinal separation line running between two adjacent laser bars in each case leads to formation of laser facets of the laser diodes to be produced, and structuring the compound at at least one longitudinal separation line, wherein a strained compensation layer is applied to the semiconductor layer sequence at least at the longitudinal separation line or the semiconductor layer sequence is at least partially removed.

LIST OF REFERENCES 1 laser diode
1A first main surface
1B second main surface
1C laser facet
1D side surface
2 laser bar
3 laser diode element
4 substrate
5 semiconductor layer sequence
5A, 5B semiconductor region
6 active zone
7 semiconductor body
8 compensation layer
9 connection layer
10 contact region
11 ridge structure
12, 17 intermediate space
13 recess
14A, 14B separation point
15 structured facet region
16 passivation layer
18 further contact region
20 laser bar compound
D thickness
L lateral direction
T depth
U lateral overlap
V vertical direction
W width
X-X' transverse separation line
Y-Y' longitudinal separation line

DETAILED DESCRIPTION

Our method of producing a plurality of laser diodes may comprise:

providing a plurality of laser bars in a compound, wherein the laser bars each comprise a plurality of laser diode elements arranged side by side, and the laser diode elements each have a common substrate and a semiconductor layer sequence arranged on the substrate, and a splitting of the compound at a longitudinal separation line running between two adjacent laser bars in each case leads to a formation of laser facets of the laser diodes to be produced, and structuring of the compound at at least one longitudinal separation line.

In this case, the above-mentioned method steps are carried out in the specified sequence.

The structuring can be done according to different alternatives. Thus, a strained compensation layer is applied to the semiconductor layer sequence at the longitudinal separation line. The compensation layer can have compressive or tensile strain. In particular, a tensile-stressed compensation layer is applied to the semiconductor layer sequence. The strain of the compensation layer can be specifically adjusted, for example, by a suitable selection of process parameters such as the process temperature and/or a suitable selection of the chemical composition of the compensation layer. The net strain, i.e., the sum of the strains occurring in the compound can be changed by the specifically strained compensation layer. Without the compensation layer, the compound typically has a lower tensile net strain than with the compensation layer. A tensile net strain has a particularly favorable effect on the separation method and leads to an improved quality of the laser facets.

The semiconductor layer sequence of the laser diode elements may be at least partially removed at the longitudinal separation line. In particular, highly strained regions, preferably highly doped p-type regions of the semiconductor layer sequence are removed so that in particular the stiffness and thus the resistance of the compound against bending is reduced. Preferably, removal is carried out by an etching method such as wet chemical etching or dry etching.

The semiconductor layer sequence may be at least partially removed at the longitudinal separation line and a compensation layer applied to the semiconductor layer sequence. The first and second alternatives are combined, whereby, compared to the first alternative, a lower tensioning of the compensation layer or, compared to the second alternative, less material removal of the semiconductor layer sequence is sufficient to improve the method.

These measures can have a positive effect on the strain conditions within the compound. Advantageously, these measures can be taken towards the end of the production method so that as little interference as possible with the conventional laser design is achieved.

Providing the plurality of laser bars in a compound preferably comprises providing a substrate and a semiconductor layer sequence comprising a plurality of semiconductor layers. The semiconductor layer sequence is preferably structured so that a semiconductor layer sequence can be assigned to each laser diode element.

The semiconductor layer sequence comprises in particular at least one active zone suitable for generation of electromagnetic radiation. The layers of the semiconductor layer sequence preferably contain at least one III/V semiconductor material such as a material from the material systems InxGayAl1-x-yP, InxGayAl1-x-yN or InxGayAl1-x-yAs, each with 0≤x, y≤1 and x+y≤1. III/V semiconductor materials are particularly suitable for radiation generation in the ultraviolet (InxGayAl1-x-yN), visible (InxGayAl1-x-yN, especially for blue to green radiation, or InxGayAl1-x-yP, especially for yellow to red radiation) up to the infrared (InxGayAl1-x-yAs) spectral range. The substrate is, for example, the growth substrate on which the semiconductor layer sequence has grown one layer after the other.

The active zone of the semiconductor layer sequence preferably comprises a pn junction, a double heterostructure, a single quantum well structure (SQW) or a multiple quantum well structure (MQW) for radiation generation. The term quantum well structure covers in particular any structure in which charge carriers can undergo a quantization of several energy states by confinements. In particular, the term quantum well structure does not contain information about the dimensionality of the quantization. It thus includes, among other things, quantum troughs, quantum wires and quantum dots and combinations of such structures.

Furthermore, the semiconductor layer sequence has in particular an n-type semiconductor region and a p-type semiconductor region, the active zone being arranged between them. The n-type semiconductor region, the active zone and the p-type semiconductor region can each comprise one or more layers. It is possible that the n-type semiconductor region, the active zone and the p-type semiconductor region contain one or more undoped layers.

The longitudinal separation lines are preferably aligned along the individual laser bars, in particular parallel to the alignment of the individual laser bars. The compound is preferably separated into a plurality of laser diodes at the longitudinal separation lines and at transverse separation lines running transversely to the longitudinal separation lines. Preferably, the compound is separated by breaking at the longitudinal and transverse separation lines.

The term "laser facet" refers to an interface, in particular a side surface, of the laser diode elements that form part of an optical resonator in the finished laser diode. The laser facet is characterized by its smooth design. In particular, "smooth" means that the surface roughness of the laser facet is significantly smaller than the wavelength of the light generated by the laser diode during operation, preferably smaller than half the wavelength, especially preferably smaller than a quarter of the wavelength.

Preferably, the laser diode elements are each formed on a first main surface with a contact region, in particular a p-conducting contact region. Furthermore, the laser diode elements can be formed on the first main surface with a connection layer, whereby the contact region is preferably applied on a side of the connection layer remote from the semiconductor layer sequence. In the finished laser diode, the contact region serves as an electrical connection area. The connection layer in particular improves the electrical contact between the contact region and the semiconductor layer sequence.

In addition, the laser diode elements can be formed on a second main surface opposite the first main surface with a further contact region, in particular an n-conducting contact region. In the finished laser diode, the further contact region serves as an additional electrical connection area. Suitable materials for the contact regions and connection layer are electrically conductive materials, preferably pure metals or metal compounds.

The contact regions of two laser diode elements directly adjacent to each other on a longitudinal separation line may be separated from each other by an intermediate space. Alternatively, the contact regions of two laser diode elements can be formed continuously, i.e., coherently, on a longitudinal separation line of directly adjacent laser diode elements. In particular, the intermediate space shall have a width of 0 μm to 200 μm, in particular 0 μm to 150 μm. Likewise, the connection layers of two laser diode elements directly adjacent to each other on a longitudinal separation line can also be separated from each other by an intermediate space or formed continuously. The intermediate space can have a width of 0 μm to 200 μm, in particular 0 μm to 150 μm. The width designates a maximum lateral expansion in one direction parallel to the transverse separation line. For example, the compensation layer can each project into the intermediate space between two connection layers.

The compensation layer may be applied to the semiconductor layer sequence or the connection layer before the contact region is applied. The strain control measure is therefore carried out towards the end of the production method so that as few changes as possible have to be made to the existing laser design. For example, the compensation layer can be applied to the semiconductor layer sequence along the longitudinal separation line in strip form and without interruption. In particular, the compensation layer extends below the respective contact region, i.e., between the semiconductor layer sequence and the contact region.

Preferably, the compensation layer is formed from an inorganic material. Suitable materials are, for example, stoichiometric or non-stoichiometric compositions of semiconductor or metal oxides as well as semiconductor or metal nitrides. Examples include silicon nitride, silicon oxide, zirconium oxide, tantalum oxide, aluminum oxide, titanium oxide or titanium tungsten nitride. Inorganic carbon compounds such as DLC ("diamond-like carbon") or silicon carbide are also possible as materials for the compensation layer. Furthermore, pure metals such as Ti, Pt, Au or Rh are suitable as materials for the compensation layer.

Preferably, the compensation layer is formed with a thickness of 20 nm to 4000 nm, preferably 50 nm to 800 nm, wherein the boundaries are enclosed. The thickness denotes a maximum expansion of the compensation layer perpendicular to a main extension plane thereof. Furthermore, the compensation layer can be formed with a width of 2 µm to 100 µm, wherein the boundaries are enclosed. The width designates a maximum lateral expansion of the compensation layer in one direction parallel to the transverse separation line.

The semiconductor layer sequence of the laser diode elements may be formed with a ridge structure. The ridge structure may be formed in particular by a raised area of the semiconductor layer sequence with a main direction of extension, which in particular runs parallel to the transverse separation line. The finished laser diodes are preferably so-called ridge waveguide laser diodes, whereby the ridge structure acts as a lateral waveguide for the emitted light.

Recesses may be produced by removing the semiconductor layer sequence in regions of the laser facets to be produced. The recesses are preferably arranged laterally of the ridge structure. However, the recesses can also extend into the ridge structure. For example, the semiconductor layer sequences can be structured in strips, in particular etched, along the longitudinal separation line between the ridge structures. The width of the strip-shaped structured area, which can be divided into a large number of recesses, can be 5 µm to 250 µm. The depth of the strip-shaped structured area can be 1 nm to 250 nm. The depth describes a maximum expansion in a negative vertical direction starting from a surface of the semiconductor layer sequence facing away from the substrate. The vertical direction is perpendicular to a plane in which the longitudinal and transverse separation lines are arranged. Preferably, the structured area or the recesses in the negative vertical direction do not extend to the substrate, but end in the semiconductor layer sequence.

In the region of the recesses, the semiconductor layer sequence has a reduced thickness. Preferably, the recesses are limited laterally, i.e., in directions parallel to a plane in which the longitudinal and transverse separation lines are arranged, at most partially by the semiconductor layer sequence. In particular, the recesses on one side are open.

The compensation layer may preferably be applied to the semiconductor layer sequence in the recesses.

In the following, various examples of laser diodes are described, which are manufactured in particular according to one of the methods described above. This means that the features revealed for the methods are also revealed for the laser diode as well as the laser bar and the compound of laser bars and vice versa.

At least one type of laser diode may comprise a semiconductor body with a substrate and a semiconductor layer sequence arranged on the substrate, which comprises an active zone that generates electromagnetic radiation. The semiconductor body has a first main surface and a second main surface opposite the first main surface and at least one first and second laser facet, each arranged transversely to the first and second main surface. "Transverse" means that a normal vector of the laser facets does not run parallel to a normal vector of the first and/or second main surface. Preferably, the laser facets limit the semiconductor body in a lateral direction. The lateral directions are arranged in a plane particularly parallel to a main extension plane of the substrate. The first main surface is preferably a surface of the semiconductor layer sequence that delimits the semiconductor body on a side of the active zone facing away from the substrate. In addition to the laser facets, the semiconductor body can have further side surfaces, each arranged transversely to the first and second main surface.

It is advantageous for the laser diode to have at least one structured facet region located at the transition between the first main surface and at least one of the two laser facets. Due to the structured facet region, the laser facets are at least approximately smooth and therefore show a high optical reflectivity.

Preferably, the structured facet region is strip-shaped. The structured facet region can extend parallel to an edge of the semiconductor body located at the transition between the first main surface and the laser facet. The structured facet region has in particular a width of 1 µm to 50 µm, wherein the boundaries are enclosed.

The first and/or second main surface of the semiconductor body can be surface composed of several partial surfaces. For example, the partial surfaces can be flat surfaces, whereby the surface normals of two adjoining partial surfaces in particular run transversely, i.e., not parallel to each other. Preferably, the laser diode comprises a ridge structure. This is especially arranged on the first main surface so that the first main surface of the semiconductor layer sequence is a surface composed of several partial surfaces.

The laser diode is preferably an edge emitter. During operation, laser radiation is emitted at one of the laser facets parallel to a normal vector of the laser facet.

The structured facet region may comprise a strained compensation layer. The structured facet region consists in particular of the compensation layer. Preferably, the ridge structure is formed over by the compensation layer. In other words, the compensation layer may extend over the ridge structure.

The structured facet region may comprise a recess. In particular, the structured facet region may consist of the recess. In the region of the recess, the semiconductor layer sequence preferably has a reduced thickness. The depth of the recess corresponds in particular to the shortest vertical extent of a side surface limiting the recess.

Preferably, the recess extends into the ridge structure.

The structured facet region may comprise a strained compensation layer and a recess. The compensation layer can be located in regions of the recess on the semiconductor layer sequence and can also extend to or over the ridge structure. As already mentioned above, compared to other examples, a less strained compensation layer or a recess of less depth compared to other examples can contribute to improving the quality of the laser facet.

The laser diode may comprise a passivation layer. The passivation layer is especially part of the lateral waveguide. Suitable materials for the passivation layer are electrically weak or non-conductive materials, especially silicon oxides or silicon nitrides. The passivation layer is preferably arranged between the compensation layer and the semiconductor layer sequence so that the guided light does not essentially penetrate into the compensation layer. The structural properties of the compensation layer can thus be selected independently, particularly with regard to refractive index and absorption properties. Preferably, the compensation layer is more strained than the passivation layer.

The structured facet region is at least partially covered by the contact region of the laser diode. A lateral overlap of the facet region with the contact region can be 0 to 125 µm. Lateral overlap is the lateral extension of a region in which the structured facet region is protruded by the contact region.

Further advantages, preferred examples and further developments of the method as well as the laser diode result from the explanations of the Drawings.

Figure 1A:
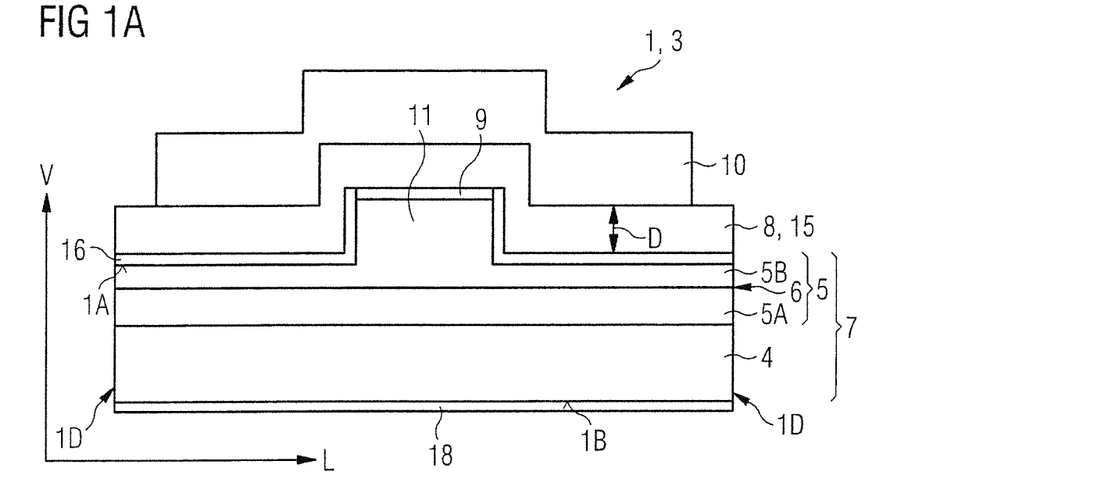
FIG. 1A shows a schematic cross-sectional view of an example of a laser diode element or a laser diode and FIG. 1B shows a schematic plan view of an example of a compound of laser bars.

In conjunction with FIGS. 1A to 2F, various examples of a method, a compound and a laser diode mentioned above are described. FIG. 1B shows a schematic plan view of a compound 20 with laser bars 2. The compound 20 can have more than the two laser bars 2 shown. The laser bars 2 each have a plurality of laser diode elements 3 arranged next to each other, the number of which may differ from the number shown. FIG. 1A shows a cross-section of a laser diode element 3 along the line A-B shown in FIG. 1B. The separated laser diode element 3 also represents a laser diode 1.

In an example of a method of producing a plurality of laser diodes 1 as shown in FIG. 1A, first the compound 20 of laser bars 2 is provided. The laser bars 2 each comprise a plurality of laser diode elements 3 arranged side by side, each of which has a common substrate 4 and a semiconductor layer sequence 5 arranged on the substrate 4 (see FIG. 1A). The semiconductor layer sequences 5 of the laser diode elements 3 are each formed with a ridge structure 11. The ridge structure 11 is formed in particular by a raised area of the semiconductor layer sequence 5 with a main direction of extension, which runs transversely, in particular perpendicular to the longitudinal separation line y-y'. The finished laser diodes 1 are in particular so-called ridge waveguide laser diodes, whereby the ridge structure 11 acts as lateral waveguide for the emitted light.

After the compound 20 has been provided, a structuring, that is to say a structure change, takes place, of the compound 20 on a longitudinal separating line y-y ', wherein a strained compensation layer 8 is applied to the semiconductor layer sequence 5 at the longitudinal separating line y-y'. The compensation layer 8 is applied along the longitudinal separation line y-y', in particular axis-symmetrically to the longitudinal separation line y-y', in strip form and preferably without interruption to the semiconductor layer sequence 5.

The compensation layer 8 counteracts the tensions occurring in the compound 20 so that the separation method can be improved at the longitudinal separation lines y-y'.

In particular, the compensation layer 8 is formed with a tensile strain. The strain of the compensation layer 8, for example, can be specifically adjusted by a suitable selection of process parameters such as the process temperature and/or a suitable selection of the chemical composition of the compensation layer 8, for example, by a non-stoichiometric composition of the compensation layer 8.

The compensation layer 8 is preferably formed with a thickness D of 20 nm to 4000 nm, preferably 50 nm to 800 nm, wherein the boundaries are enclosed. The thickness D denotes a maximum expansion of the compensation layer 8 perpendicular to a main extension plane thereof. Furthermore, the compensation layer 8 can be formed with a width W of 2 µm to 100 µm, whereby the limits are included. The width W denotes a maximum lateral expansion of the compensation layer 8 in a direction parallel to the transverse separation line x-x'. In particular, compensation layer 8 is formed from an inorganic material. Suitable materials are, for example, stoichiometric or non-stoichiometric compositions of semiconductor or metal oxides as well as semiconductor or metal nitrides. Examples include silicon nitride, silicon oxide, zirconium oxide, tantalum oxide, aluminum oxide, titanium oxide or titanium tungsten nitride. Inorganic carbon compounds such as DLC ("diamond-like carbon") or silicon carbide are also possible as materials for the compensation layer 8. Furthermore, pure metals such as Ti, Pt, Au or Rh are suitable as materials for the compensation layer 8.

In a further method step, contact regions 10 are applied to the semiconductor layer sequences 5 of the laser diode elements 3. These are arranged such that they partially cover the compensation layer 8. A lateral overlap U of the compensation layer 8 with a contact region 10 can be 0 to 100 µm, in particular 0 to 50 µm. In the finished laser diode 1, contact region 10 serves as an electrical connection area. In addition, the laser diode elements 3 can be formed on a second main surface opposite the first main surface, each with a further contact region 18. In the finished laser diode 1, the further contact region 18 serves as a further electrical connection area. Suitable materials for contact regions 10, 18 are electrically conductive materials, preferably pure metals or metal compounds.

A connection layer 9 can be arranged between the contact region 10 and the semiconductor layer sequence 5. In the finished laser diode 1, the connection layer 9 is intended in particular to improve the electrical contact between the contact region 10 and the semiconductor layer sequence 5. Suitable materials for connection layer 9 are electrically conductive materials, preferably pure metals or metal compounds.

Figure 1B:
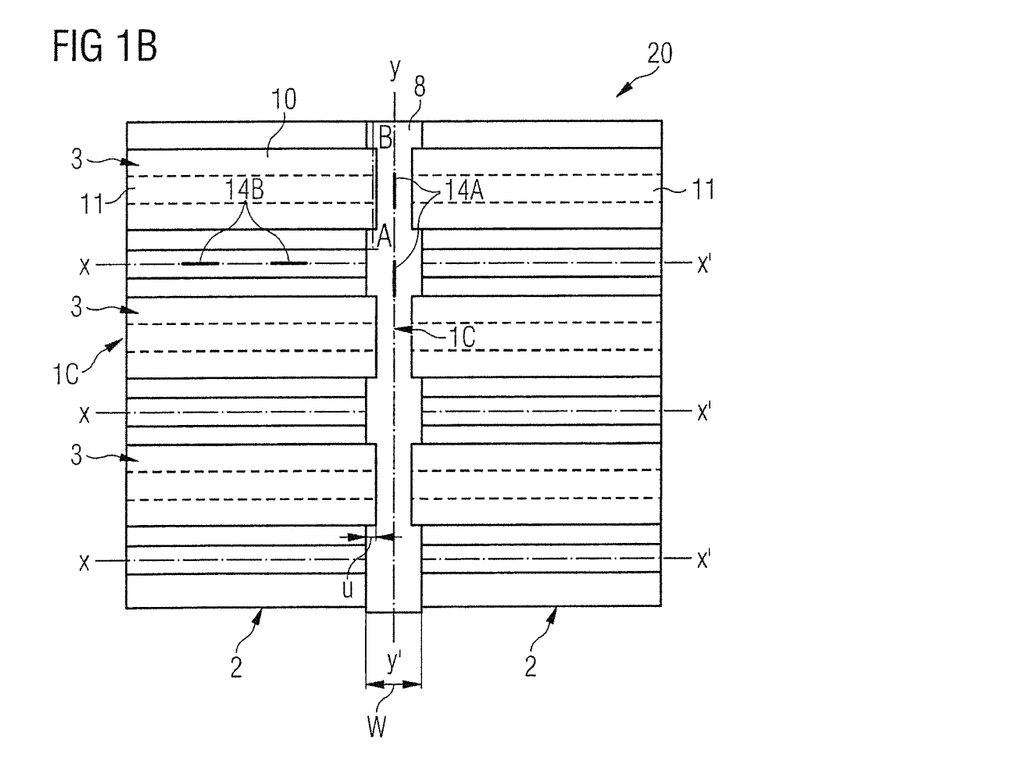

The compound 20 is split into a plurality of laser bars 2 at a longitudinal separation line y-y' running between two adjacent laser bars 2. Furthermore, the separated laser bars 2 are separated into a plurality of laser diodes 1 at a transverse separation line x-x' running between two adjacent laser diode elements 3, which runs transversely, in particular perpendicularly, to the longitudinal separation line y-y'. At its main surface facing away from substrate 3, the compound 20 advantageously comprises separation points 14A along the longitudinal separation line y-y'. Furthermore, the compound 20 can comprise separation points 14B along the transverse separation line x-x'. The separation points 14A, 14B are in particular recesses in the compound 20 that allow a targeted fragmentation. In particular, the compound 20 is separated by breaking at the longitudinal and transverse separation lines y-y', x-x', whereby the separation points 14A, 14B serve as predetermined breaking points.

By splitting the compound 20 at one longitudinal separation line y-y' between two adjacent laser bars 2, laser facets 1C of laser diodes 1 are formed at each laser diode element 3.

A laser diode 1 as shown in FIG. 1A, for example, produced by a method as described in connection with FIG. 1B, comprises a semiconductor body 7 having a substrate 4 and a semiconductor layer sequence 5 arranged on the substrate 4, which comprises an active zone 6 that generates electromagnetic radiation. Furthermore, the semiconductor layer sequence 5 comprises in particular an n-type semiconductor region 5A and a p-type semiconductor region 5B, with the active zone 6 being arranged between them. Furthermore, semiconductor body 7 comprises a first main surface 1A and a second main surface 1B opposite the first main surface 1A and at least one first and second laser facet 1C, each of which is arranged substantially transversely to the first and second main surfaces 1A, 1B. "Transverse" means that a normal vector of the laser facets 1C does not run parallel to a normal vector of the first and/or second main surface 1A, 1B. Preferably, the laser facets 1C limit the semiconductor body 7 in a lateral direction. The lateral directions L run transversely, especially perpendicularly, to a vertical direction V, in which the semiconductor layer sequence 5 is arranged on the substrate 4. The first main surface 1A is preferably a surface of the semiconductor layer sequence 5, which delimits the semiconductor body 7 on a side of the active zone 6 remote from substrate 4. In addition to the laser facets 1C, the semiconductor body 7 can further comprise side surfaces 1D, each of which is arranged largely transversely to the first and second main surfaces 1A, 1B.

Laser diode 1 has one or more structured facet regions 15 located at the transition between the first main surface 1A and at least one of the two laser facets 1C. Due to the structured facet region 15, the laser facets 1C are at least approximately smooth. With the laser diode 1 shown in FIG. 1A, the structured facet region 15 consists of the strained compensation layer 8.

The structured facet region 15 is strip-shaped and extends parallel to an edge of the semiconductor body 7, which is located at the transition between the first main surface 1A and the laser facet 1C. The structured facet region 15 has a width of 1 µm to 50 µm, wherein the boundaries are enclosed.

The first and/or second main surface 1A, 1B of the semiconductor body 7 can be a surface composed of several partial surfaces. For example, the partial surfaces can be flat surfaces, whereby the surface normal of two adjoining partial surfaces in particular run transversely, i.e., not parallel, to each other. Laser diode 1 comprises the ridge structure 11. This is arranged on the first main surface 1A so that the first main surface 1A is a surface composed of several partial surfaces. The ridge structure 11 is formed over by the compensation layer 8. In other words, the compensation layer 8 extends over the ridge structure 11.

Laser diode 1 comprises a passivation layer 16. The passivation layer 16 is part of the lateral waveguide. The passivation layer 16 is arranged between the compensation layer 8 and the semiconductor layer sequence 5 so that the guided light does not essentially penetrate into the compensation layer 8. The structural properties of the compensation layer 8 can thus be selected independently, particularly with regard to refractive index and absorption properties.

Laser diode 1 is preferably an edge emitter. During operation, laser radiation is emitted at one of the laser facets 1C in parallel to a normal vector of the laser facet 1C.

Figure 2A:
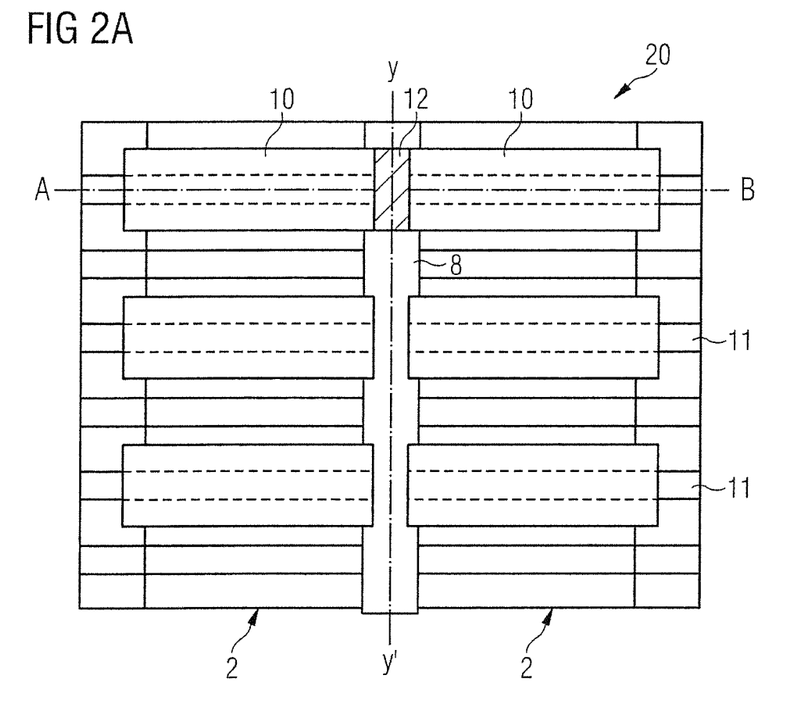
FIG. 2A shows a schematic plan view of an example of a compound of laser bars and FIGS. 2B to 2F schematic cross-sectional views of examples of the compound.

FIGS. 2B to 2F schematically show sections of cross-sections along the line A-B drawn in FIG. 2A of various examples of a compound 20.

Figure 2B:
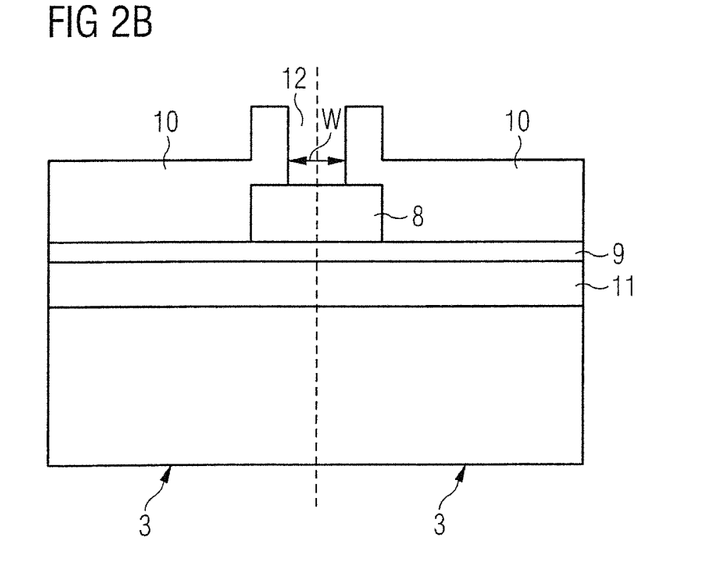
Figure 2C:
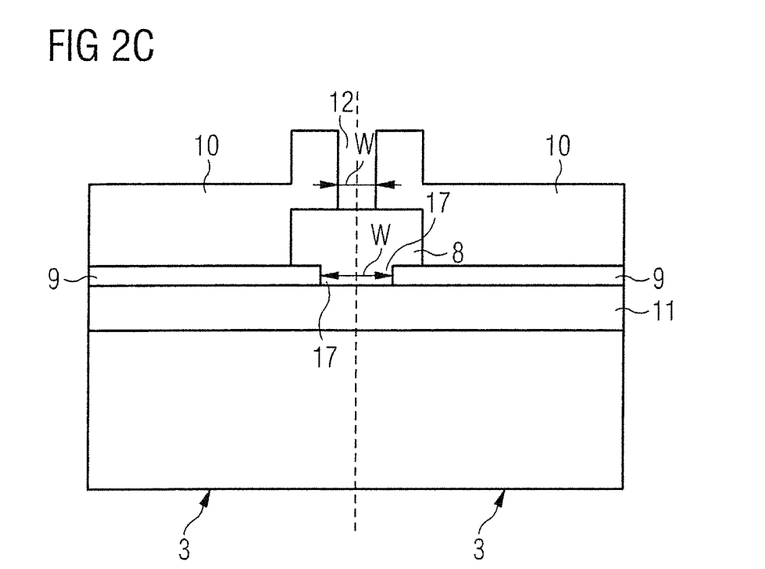
Figure 2D:
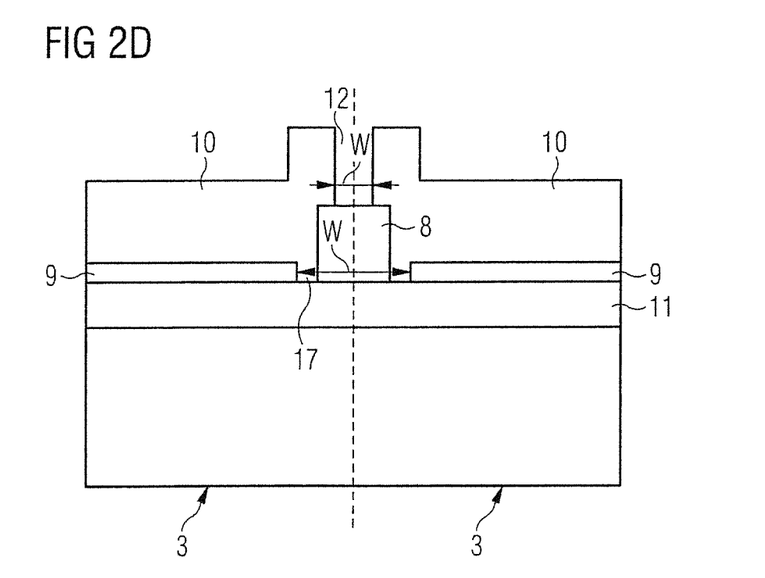

In the examples shown in FIGS. 2B to 2D, the contact regions 10 of two laser diode elements 3 directly adjacent to each other on a longitudinal separation line y-y' are separated from each other by an intermediate space 12. In particular, the intermediate space 12 has a width W greater than 0 µm and not exceeding 200 µm, in particular not exceeding 150 µm. Likewise, the connection layers 9 of two laser diode elements 3 directly adjacent to each other on a longitudinal separation line y-y' can also be separated from each other by an intermediate space 17 (see FIGS. 2C and 2D) or formed continuously (see FIG. 2B). The intermediate space 17 can have a width W of 0 µm to 200 µm, in particular 0 µm to 150 µm. The compensation layer 8 projects particularly into the intermediate space 17 between two connection layers 9.

Figure 2E:
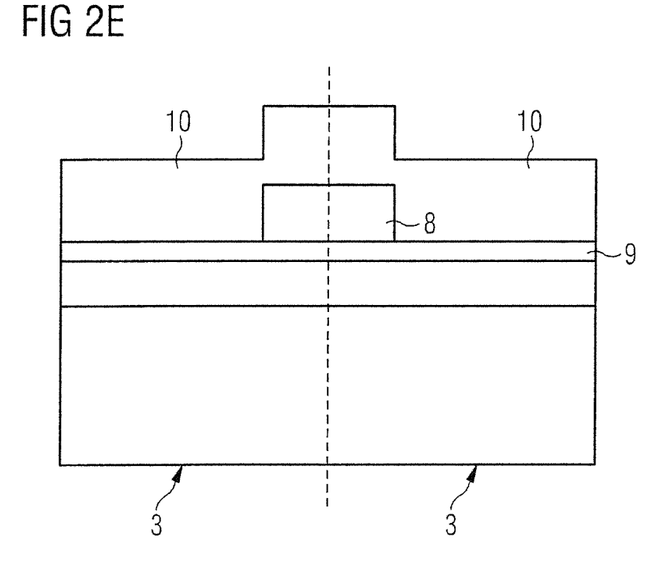
Figure 2F:
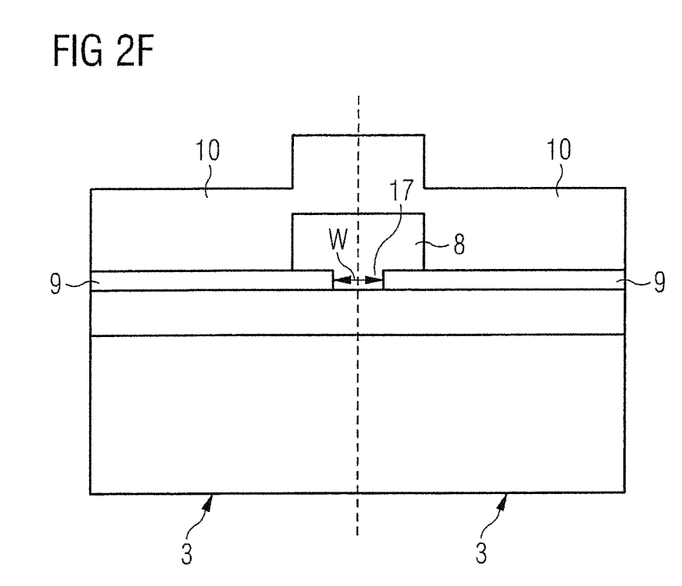

As shown in FIGS. 2E and 2F, alternatively the contact regions 10 of two laser diode elements 3 directly adjacent to each other can be formed continuously, i.e., coherently, on a longitudinal separation line y-y'. The connection layers 9 of two laser diode elements 3 directly adjacent to each other on a longitudinal separation line y-y' can be separated from each other by an intermediate space 17 with a width W of 0 µm to 200 µm, in particular 0 µm to 150 µm (see FIG. 2F) or formed continuously (see FIG. 2E).

Figure 3A:
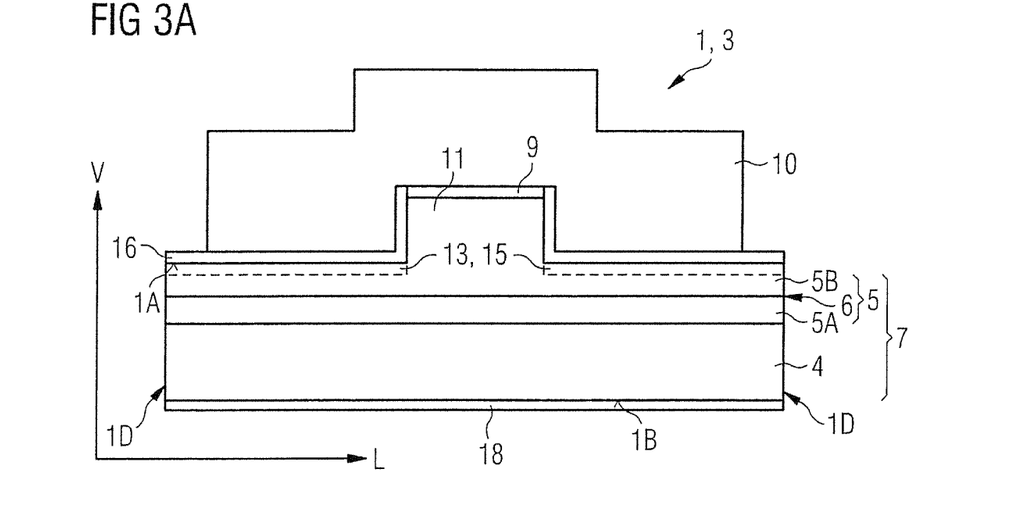
FIG. 3A shows a schematic side view of an example of a laser diode element or a laser diode and FIG. 3B is a schematic top view of another example of a compound of laser bars.

In conjunction with FIGS. 3A to 4E, various examples of a method, compound and a laser diode mentioned above are described. FIG. 3B shows a schematic plan view of a compound 20 comprising laser bars 2. The laser bars 2 each comprise a plurality of laser diode elements 3 arranged next to each other. FIG. 3A shows a cross-section of a laser diode element 3 along the line A-B shown in FIG. 3B. The separated laser diode element 3 also represents a laser diode 1.

In an example of a method for the production of a plurality of laser diodes 1 as shown in FIG. 3A, first the compound 20 of laser bars 2 is provided. The laser bars 2 each comprise a plurality of laser diode elements 3 arranged side by side, each of which has a common substrate 4 and a semiconductor layer sequence 5 arranged on the substrate 4 (see FIG. 3A). The semiconductor layer sequences 5 of the laser diode elements 3 are each formed with a ridge structure 11. The ridge structure 11 is formed in particular by a raised area of the semiconductor layer sequence 5 with a main direction of extension, which runs transversely, in particular perpendicular to the longitudinal separation line y-y'. The finished laser diodes 1 are in particular so-called ridge waveguide laser diodes, whereby the ridge structure 11 acts as lateral waveguide for the emitted light.

After compound 20 has been provided, the compound 20 is structured, i.e., the structure is changed, at a longitudinal separation line y-y', whereby the semiconductor layer sequence 5 of the laser diode elements 3 is removed at the longitudinal separation line y-y'. In particular, highly strained regions, preferably highly doped p-type regions, of the semiconductor layer sequence 5 are removed so that in particular the stiffness and thus the resistance of the compound 20 to bending is reduced. The semiconductor layer sequence 5 can be removed up to the substrate 4. Preferably the removal is carried out by an etching method such as wet chemical etching or dry etching.

The compound 20 is structured in strip form along the longitudinal separation line y-y' between two ridge structures 11. This results in recesses 13 in the semiconductor layer sequences 5 of the laser diode elements 3, which are arranged in regions of the laser facets 1C to be generated. In the example shown, the recesses 13 are arranged to the side of the ridge structure 11. However, the recesses 13 can also extend into the ridge structure 11.

The width W of the strip-shaped structured region can be 5 µm to 250 µm. The depth T of the strip-shaped structured region can be 1 nm to 250 nm (see FIGS. 4B to 4D). The depth T denotes a maximum expansion in a negative vertical direction starting from a surface of the semiconductor layer sequence 5 facing away from the substrate 4. The recess 13 preferably does not extend to the substrate in a negative vertical direction, but ends in the semiconductor layer sequence 5.

In a further method step, contact regions 10 are applied to the semiconductor layer sequences 5 of the laser diode elements 3. The contact regions 10 can each extend into the recesses 13. A lateral overlap U of a recess 13 with a contact region 10 can be 0 µm to 125 µm. In the finished laser diode 1, the contact region 10 serves as an electrical connection area. In addition, the laser diode elements 3 can be formed on a second main surface opposite the first main surface, each with a further contact region 18. In the finished laser diode 1, the further contact region 18 serves as a further electrical connection area. Suitable materials for the contact regions 10, 18 are electrically conductive materials, preferably pure metals or metal compounds.

A connection layer 9 can be arranged between the contact region 10 and the semiconductor layer sequence 4. In the finished laser diode 1, the connection layer 9 is intended in particular to improve the electrical contact between the contact region 10 and the semiconductor layer sequence 4. Suitable materials for the connection layer 9 are electrically conductive materials, preferably pure metals or metal compounds.

Figure 3B:
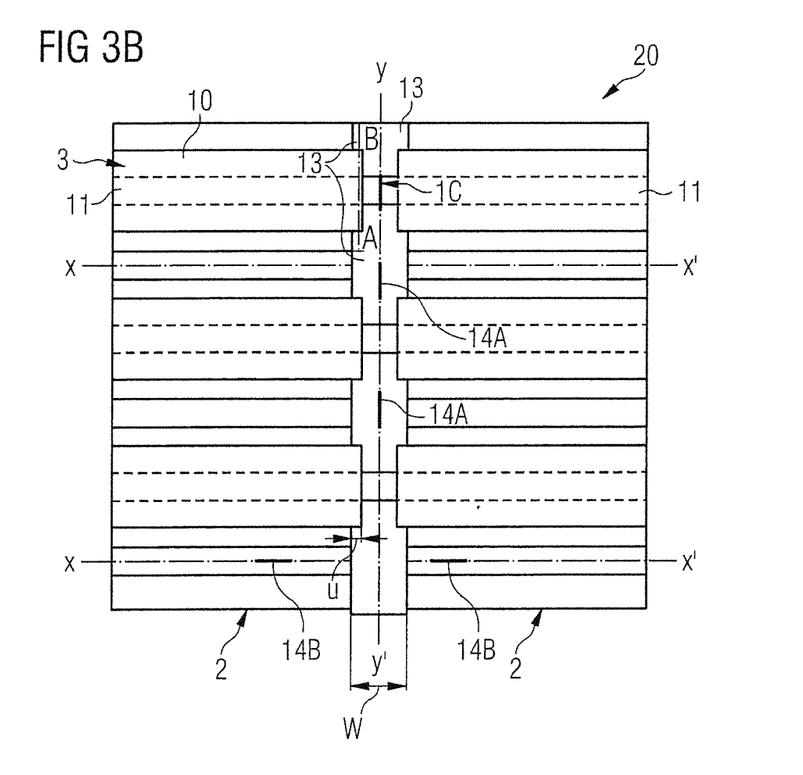

The compound 20 is split into a plurality of laser bars 2 at a longitudinal separation line y-y' running between two adjacent laser bars 2. Furthermore, the separated laser bars 2 are separated into a plurality of laser diodes 1 at a transverse separation line x-x' running between two adjacent laser diode elements 3, which runs transversely, in particular perpendicularly, to the longitudinal separation line y-y'. At its main surface facing away from the substrate 3, the compound advantageously comprises 20 separation points 14A along the longitudinal separation line y-y'. Furthermore, the compound 20 can comprise separation points 14B along the transverse separation line x-x'. The separation points 14A, 14B are recesses in the compound 20, which allow a targeted separation. In particular, the compound 20 is separated by breaking at the longitudinal and transverse separation lines y-y', x-x', whereby the separation points 14A, 14B serve as predetermined breaking points.

By splitting the compound 20 at one longitudinal separation line y-y' between two adjacent laser bars 2, laser facets 1C of laser diodes 1 are formed at each laser diode element 3.

A laser diode 1 as shown in FIG. 3A, for example, produced by a method as described in conjunction with FIG. 3B, comprises a semiconductor body 7 having a substrate 4 and a semiconductor layer sequence 5 arranged on the substrate 4, which comprises an active zone 6 that generates electromagnetic radiation. Furthermore, the semiconductor layer sequence 5 has in particular an n-type semiconductor region 5A and a p-type semiconductor region 5B, with the active zone 6 being arranged between them. Furthermore, the semiconductor body 7 comprises a first main surface 1A and a second main surface 1B opposite the first main surface 1A and at least one first and second laser facet 1C, which are arranged transversely to the first and second main surfaces 1A, 1B respectively. Preferably the laser facets 1C limit the semiconductor body 7 in a lateral direction L. In addition to the laser facets 1C, the semiconductor body 7 can comprise further side surfaces 1D, which are each arranged transversely to the laser facets 1C.

Laser diode 1 has one or more structured facet regions 15 located at the transition between the first main surface 1A and at least one of the two laser facets 1C. Due to the structured facet region 15, the laser facets 1C are at least approximately smooth. In the laser diode 1 shown in FIG. 3A, the structured facet region 15 consists of the recess 13. The structured facet region 15 has in particular a width of 3 µm to 125 µm, wherein the boundaries are enclosed. The structured facet regions 13 are arranged laterally of the ridge structure 11 and each provide a step in the semiconductor layer sequence 5 in regions arranged along the ridge structure 11.

The first and/or second main surface 1A, 1B of the semiconductor body 7 can be a surface composed of several partial surfaces. For example, the partial surfaces can be flat surfaces, whereby the surface normal of two adjoining partial surfaces in particular run transversely, i.e., not parallel, to each other. The laser diode 1 comprises the ridge structure 11. This is arranged on the first main surface 1A so that the first main surface 1A is a surface composed of several partial surfaces.

Laser diode 1 comprises a passivation layer 16. The passivation layer 16 is part of the lateral waveguide. The passivation layer 16 is arranged between the semiconductor layer sequence 5 and the contact region 10. In particular, the semiconductor layer sequence 5 in the recesses 15 is covered by the passivation layer 16.

Laser diode 1 is preferably an edge emitter. During operation, laser radiation is emitted at one of the laser facets 1C in parallel to a normal vector of the laser facet 1C.

Figure 4A:
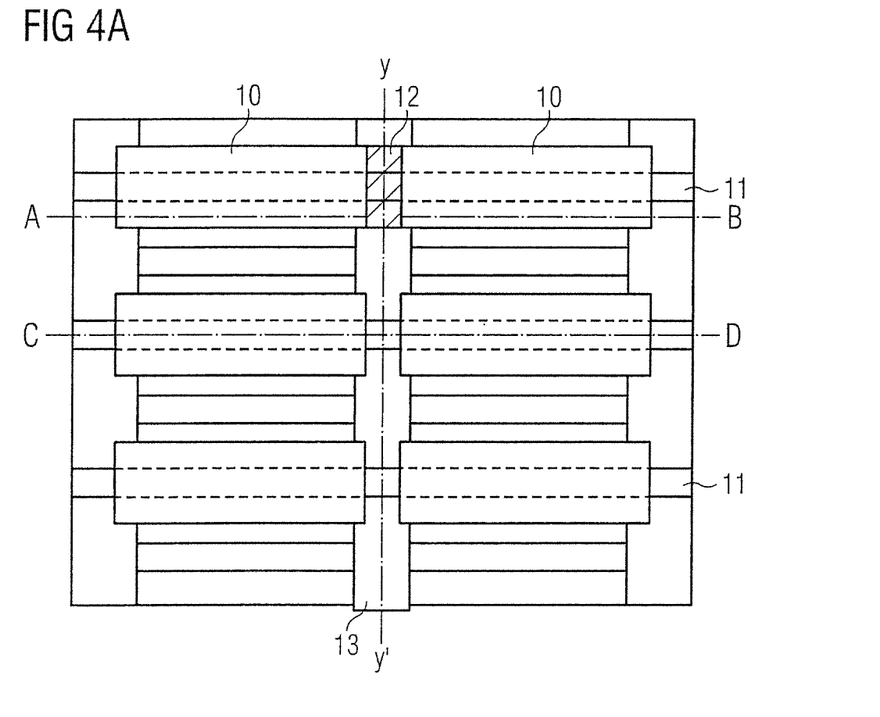
FIG. 4A shows a schematic plan view of an example of a compound of laser bars and FIGS. 4B to 4E schematic cross-sectional views of other examples of the compound.
Figure 4B:
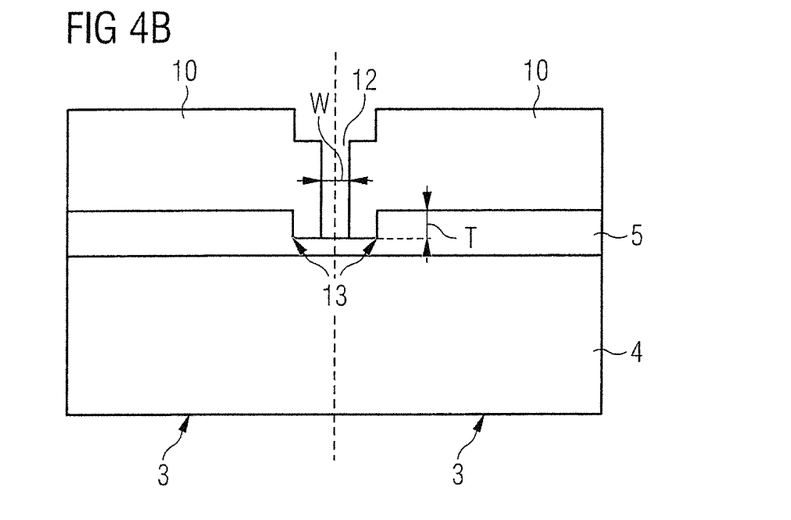
Figure 4C:
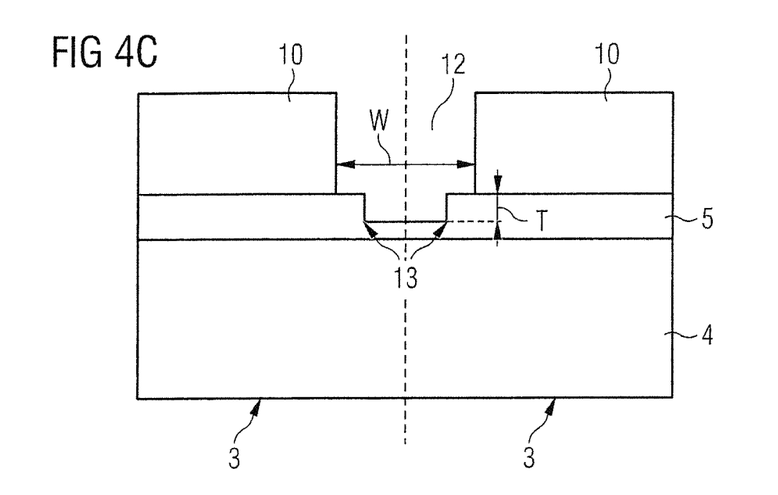
Figure 4D:
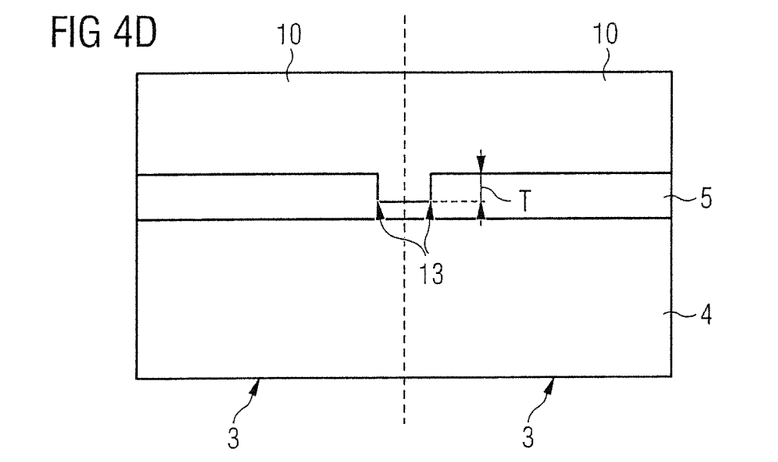
Figure 4E:
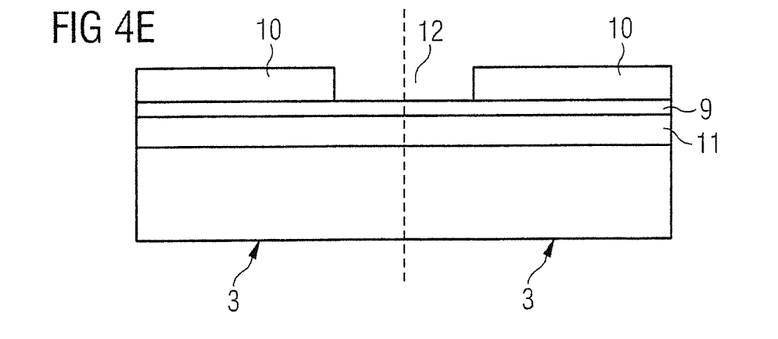

FIGS. 4B to 4D schematically show sections of cross-sections of various examples of a compound 20 along the line A-B drawn in FIG. 4A. Furthermore FIG. 4E shows a section of a schematic cross-section along the line C-D shown in FIG. 4A.

In the examples shown in FIGS. 4B and 4C, the contact regions 10 of two laser diode elements 3 directly adjacent to each other on a longitudinal separation line y-y' are separated from each other by an intermediate space 12. The width W of the intermediate space 12 can be smaller (FIG. 4B) or larger (FIG. 4C) than the width of the structured area, which has several recesses 13. In other words, the contact regions 10 may extend into recesses 13 (see FIG. 4B). FIG. 4D shows another example in which the contact regions 10 are formed continuously and extend into the recesses 13.

As FIGS. 4B to 4E show, the connection layer 9 is only arranged on the ridge structure 11, but not in the region of the recesses 13.

Figure 5A:
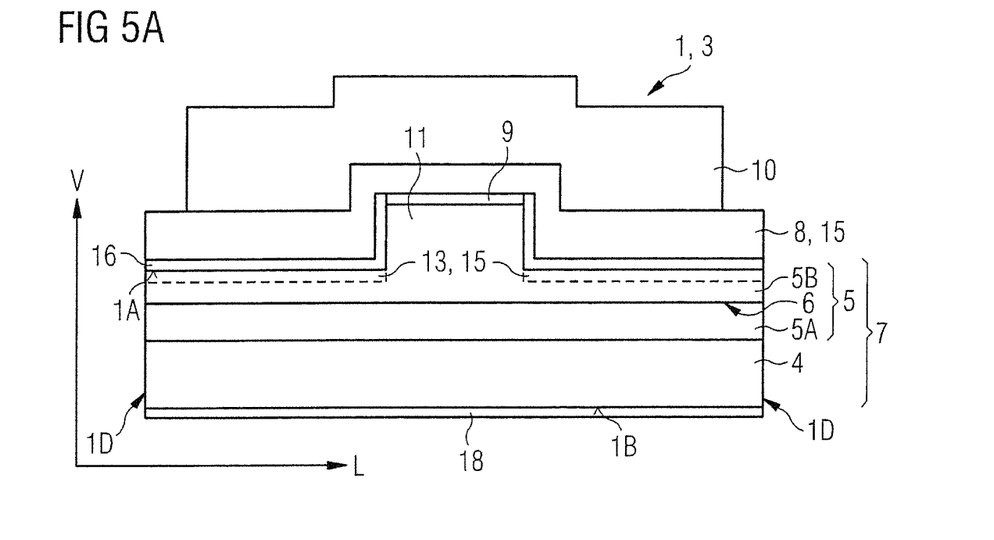
FIG. 5A shows a schematic side view of an example of a laser diode element or a laser diode and FIG. 5B is a schematic top view of another example of a compound of laser bars.
Figure 5B:
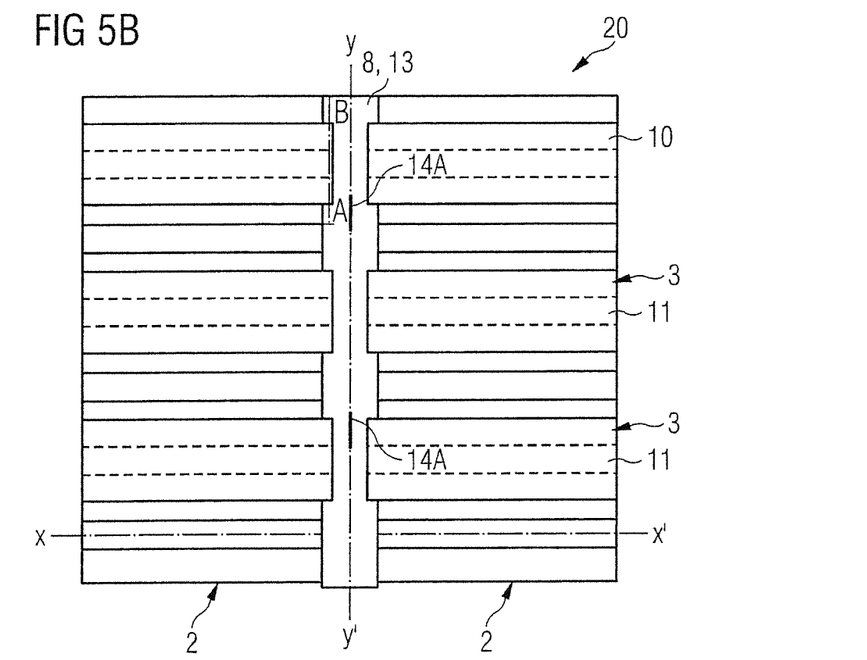

In conjunction with FIGS. 5A and 5B, a method, compound and a laser diode according to the third variant mentioned above are described. FIG. 5B shows a schematic plan view of a compound 20 with laser bars 2. FIG. 5A shows a cross-section of a laser diode element 3 along the line A-B shown in FIG. 5B. The separated laser diode element 3 also represents a laser diode 1.

In an example of a method of producing a plurality of laser diodes 1 as shown in FIG. 5A, first the compound 20 of laser bars 2 is provided. The laser bars 2 each comprise a plurality of laser diode elements 3 arranged side by side, each of which has a common substrate 4 and a semiconductor layer sequence 5 arranged on the substrate 4 (see FIG. 5A). The semiconductor layer sequences 5 of the laser diode elements 3 are each formed with a ridge structure 11. The ridge structure 11 is formed in particular by a raised area of the semiconductor layer sequence 5 with a main direction of extension, which runs transversely, in particular perpendicular to the longitudinal separation line y-y'. The finished laser diodes 1 are in particular so-called ridge waveguide laser diodes, whereby ridge structure 11 acts as lateral waveguide for the emitted light.

After compound 20 has been provided, a structuring, i.e., a structural change, of compound 20 takes place at a longitudinal separation line y-y'. First, the semiconductor layer sequence 5 of the laser diode elements 3 at the longitudinal separation line y-y' is removed. Removal is preferably carried out using a procedure as described in conjunction with FIGS. 3A to 4E. In particular, the compound 20 is structured in strip form along the longitudinal separation line y-y' between two ridge structures 11. This results in recesses 13 in the semiconductor layer sequences 5 of the laser diode elements 3 arranged in regions of the 1C laser facets to be generated. Then a compensation layer 8 is applied to the semiconductor layer sequence 5. The application of the compensation layer 8 is preferably carried out by a method as described in conjunction with FIGS. 1A to 2F.

The compensation layer 8 is applied along the longitudinal separation line y-y', in particular axis-symmetrically to the longitudinal separation line y-y', in strip form and preferably without interruption to the semiconductor layer sequence 5. The compensation layer 8 is preferably arranged both on the ridge structures 11 and in the recesses 13. The structural condition of the recesses 13 and compensation layer 8 corresponds in particular to the examples described above.

In further method steps, contact regions 10 as well as connection and passivation layers 9, 16 can be applied to the semiconductor layer sequences 5 as already described.

The advantage of the third example is that, compared to the first example, a lower strain of the compensation layer 8 or, compared to the second example, less removal of the semiconductor layer sequence 5 is sufficient to improve the method.

A laser diode 1 as shown in FIG. 5A, for example, produced by a method as described in connection with FIG. 5B, comprises a semiconductor body 7 having a substrate 4 and a semiconductor layer sequence 5 arranged on the substrate 4, which comprises an active zone 6 that generates electromagnetic radiation. Moreover, the semiconductor layer sequence 5 has in particular an n-type semiconductor region 5A and a p-type semiconductor region 5B, with the active zone 6 being arranged between them. Furthermore, the semiconductor body 7 has a first main surface 1A and a second main surface 1B opposite the first main surface 1A and at least one first and second laser facet 1C, which are arranged transversely to the first and second main surfaces 1A, 1B respectively. Preferably, the 1C laser facets limit the semiconductor body 7 in a lateral direction. The first main surface 1A is preferably a surface of the semiconductor layer sequence 5, which delimits the semiconductor body 7 on a side of the active zone 6 remote from the substrate 4. In addition to the laser facets 1C, the semiconductor body 7 can have additional side surfaces 1D, each arranged transversely to the laser facets 1C.

Laser diode 1 has one or more structured facet regions 15 located at the transition between the first main surface 1A and at least one of the two laser facets 1C. Due to the structured facet region 15, the laser facets 1C are at least approximately smooth. In the laser diode 1 shown in FIG. 5A, the structured facet region 15 comprises a recess 13 in the semiconductor layer sequence 5 and a compensation layer 8 arranged on the semiconductor layer sequence 5. The structured facet region 15 in particular has a width of 1 μm to 125 μm, wherein the boundaries are enclosed. The structured facet region 13 is arranged laterally of the ridge structure 11 and on the ridge structure 11, whereby the compensation layer 8 is arranged on the ridge structure 11 and the recesses 13 are arranged laterally of the ridge structure 11.

Laser diode 1 has a passivation layer 16. The passivation layer 16 is part of the lateral waveguide. The passivation layer 16 is arranged between the semiconductor layer sequence 5 and the contact region 10. In particular, the semiconductor layer sequence 5 in the recesses 13 is covered by the passivation layer 16 and the connection layer 8.

Laser diode 1 is preferably an edge emitter. During operation, laser radiation is emitted at one of the laser facets 1C parallel to a normal vector of the laser facet 1C.

My laser diodes and methods are not limited by the description by the examples. Rather, this disclosure includes each new feature and each combination of features, which includes in particular each combination of features in the appended claims, even if the feature or combination itself is not explicitly indicated in the claims or examples.

This application claims priority of DE 10 2017 117 135.5, the subject matter of which is incorporated herein by reference.

The invention claimed is:

1. A method of producing a plurality of laser diodes comprising:
   providing a plurality of laser bars in a compound, wherein the laser bars each comprise a plurality of laser diode elements arranged side by side, the laser diode elements each have a common substrate and a semiconductor layer sequence arranged on the substrate, and a splitting of the compound at a longitudinal separation line running between two adjacent laser bars in each case leads to formation of laser facets of the laser diodes to be produced, and
   structuring the compound at least one longitudinal separation line, wherein a strained compensation layer is applied to the semiconductor layer sequence at least at the longitudinal separation line.

2. The method according to claim 1, wherein the laser diode elements are each formed on a first main surface with a contact region and a connection layer, and the contact region is applied on a side of the connection layer remote from the semiconductor layer sequence, and at least the contact regions or connection layers of two laser diode elements directly adjacent at a longitudinal separation line are separated from one another by an intermediate space or formed continuously.

3. The method according to claim 2, wherein the strained compensation layer is applied to the connection layer before the contact regions are applied.

4. The method according to claim 2, wherein the strained compensation layer each extends into the intermediate space between two connection layers.

5. The method according to claim 1, wherein the strained compensation layer is composed of an inorganic material.

6. The method according to claim 1, wherein the strained compensation layer is applied to the semiconductor layer sequence along the longitudinal separation line in strip form and without interruption.

7. The method according to claim 1, wherein the semiconductor layer sequence of the laser diode elements are each formed with a ridge structure.

8. The method according to claim 1, wherein recesses are produced by removing the semiconductor layer sequence in regions of the laser facets to be generated.

9. The method according to claim 8, wherein the compensation layer is applied to the semiconductor layer sequences in the recesses.

10. The method according to claim 1, wherein separation of the compound into a plurality of laser diodes is effected by breaking the compound at the longitudinal separation lines and transverse separation lines extending transversely to the longitudinal separation lines.

11. The method according to claim 1, wherein the semiconductor layer sequence is at least partially removed.

12. A method of producing a plurality of laser diodes comprising:

providing a plurality of laser bars in a compound, wherein the laser bars each comprise a plurality of laser diode elements arranged side by side, the laser diode elements each have a common substrate and a semiconductor layer sequence arranged on the substrate, and a splitting of the compound at a longitudinal separation line running between two adjacent laser bars in each case leads to formation of laser facets of the laser diodes to be produced, and structuring the compound at at least one longitudinal separation line, wherein the semiconductor layer sequence is at least partially removed and recesses are produced by removing the semiconductor layer sequence in regions of the laser facets to be generated, the laser diode elements are each formed on a first main surface with a contact region, and the contact regions each extend into the recesses.

13. The method according to claim 1, wherein the compensation layer is strained in a tensile manner.

* * * * *

UNITED STATES PATENT AND TRADEMARK OFFICE
CERTIFICATE OF CORRECTION

PATENT NO. : 10,651,625 B2
APPLICATION NO. : 16/046173
DATED : May 12, 2020
INVENTOR(S) : Gerhard It is certified that error appears in the above-identified patent and that said Letters Patent is hereby corrected as shown below:

In the Claims

In Column 14, Claim 1:
At Line 25, after "compound" please insert --at--.

Signed and Sealed this
Fourteenth Day of July, 2020

Andrei Iancu
*Director of the United States Patent and Trademark Office*